US009231557B2

(12) United States Patent
Umeda et al.

(10) Patent No.: US 9,231,557 B2
(45) Date of Patent: Jan. 5, 2016

(54) DUPLEXER

(75) Inventors: Keiichi Umeda, Nonoi (JP); Kenichi Uesaka, Ishikawa-gun (JP); Takashi Miyake, Hakusan (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 727 days.

(21) Appl. No.: 12/435,422

(22) Filed: May 5, 2009

(65) Prior Publication Data

US 2009/0315640 A1  Dec. 24, 2009

(30) Foreign Application Priority Data

Jun. 24, 2008 (JP) ................. 2008-165030

(51) Int. Cl.
*H03H 9/54* (2006.01)
*H03H 9/72* (2006.01)
*H03H 9/70* (2006.01)
*H03H 9/00* (2006.01)
*H03H 9/64* (2006.01)

(52) U.S. Cl.
CPC ............. *H03H 9/706* (2013.01); *H03H 9/0028* (2013.01); *H03H 9/725* (2013.01)

(58) Field of Classification Search
USPC ......... 333/187, 188, 189, 192, 193, 194, 195, 333/133
See application file for complete search history.

(56) References Cited

U.S. PATENT DOCUMENTS

| 5,854,579 | A  | * | 12/1998 | Penunuri ................... 333/193 |
| 5,872,493 | A  | * | 2/1999 | Ella ........................ 333/191 |
| 6,351,197 | B1 | * | 2/2002 | Selmeier et al. ............. 333/195 |
| 6,424,238 | B1 | * | 7/2002 | Penunuri ................... 333/187 |
| 6,897,740 | B2 | * | 5/2005 | Fujino et al. ............... 333/133 |
| 7,116,040 | B2 | * | 10/2006 | Inoue ............... H03H 9/02118 310/320 |
| 7,211,931 | B2 | * | 5/2007 | Nishihara ......... H03H 9/02133 310/324 |
| 7,446,629 | B2 |   | 11/2008 | Nakamura |
| 8,093,962 | B2 | * | 1/2012 | Taniguchi et al. . H03H 9/02133 310/365 |
| 2006/0066419 | A1 |  | 3/2006 | Iwaki et al. |
| 2007/0296521 | A1 |  | 12/2007 | Schmidhammer |

FOREIGN PATENT DOCUMENTS

| JP | 2006-74749 A  | 3/2006 |
| JP | 2006-129445 A | 5/2006 |
| JP | 2008-504756 A | 2/2008 |

* cited by examiner

*Primary Examiner* — Dean Takaoka
(74) *Attorney, Agent, or Firm* — Keating & Bennett, LLP

(57) ABSTRACT

A duplexer includes a transmitting filter including serial resonators and parallel resonators connected in a ladder configuration, and a receiving filter. A resonator of the serial resonators and the parallel resonators in the transmitting filter that is arranged closest to a common terminal of the transmitting filter and the transmitting filter includes a surface acoustic wave resonator, and at least one resonator excluding the resonator that is arranged closest to the common terminal includes a film bulk acoustic wave resonator.

5 Claims, 7 Drawing Sheets

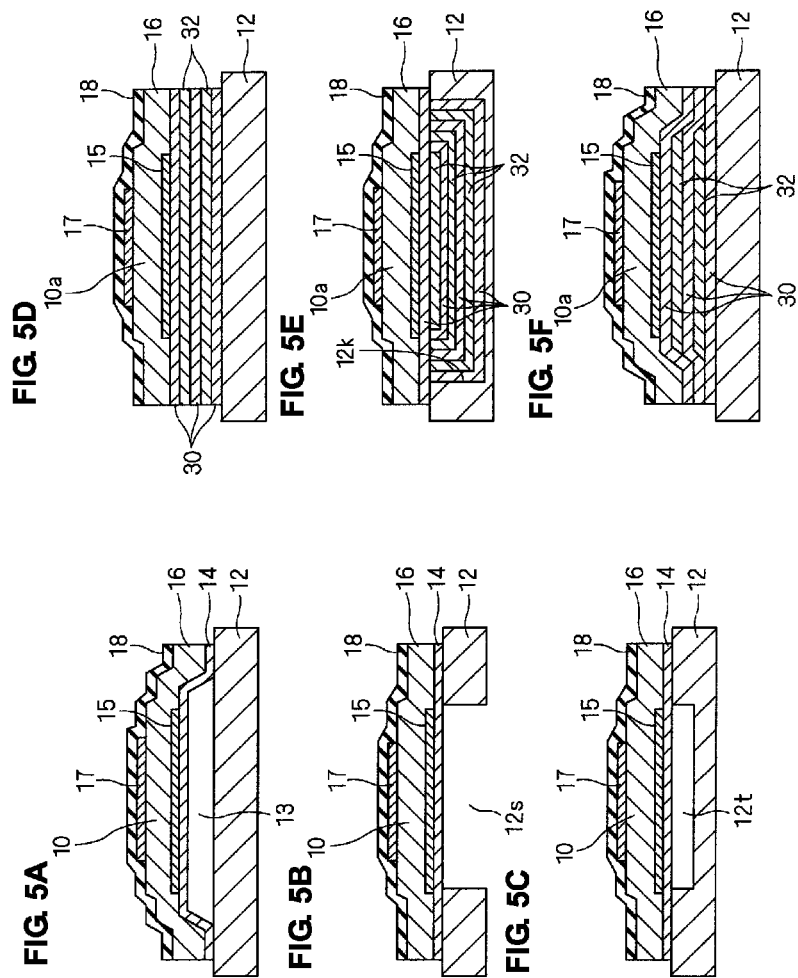

DUPLEXER

BACKGROUND OF THE INVENTION

1. Field of the Invention

The present invention relates to duplexers and, in particular, to a duplexer for use in a mobile telephone system, for example.

2. Description of the Related Art

A duplexer for separating transmission and reception signals in a mobile radio wave band is disclosed in Japanese Unexamined Patent Application Publication No. 2008-504756. As illustrated in a circuit diagram of FIG. 7, the disclosed duplexer includes a receiving filter 1, arranged in a reception path RX, which operates using a surface acoustic wave (SAW) and a transmitting filter 2, arranged in a transmission path TX, which operates using a bulk acoustic wave (BAW).

Since a BAW piezoelectric resonator, which is inferior to a SAW resonator in secondary non-linear characteristics, is used in the transmitting filter of the duplexer, a significant amount of intermodulation distortion (IMD) is generated.

SUMMARY OF THE INVENTION

To overcome the problem described above, preferred embodiments of the present invention provide a duplexer that controls the generation of IMD.

A duplexer according to a preferred embodiment of the present invention includes a transmitting filter including serial resonators and parallel resonators connected in a ladder arrangement and a receiving filter. A resonator of the serial resonators and the parallel resonators in the transmitting filter that is arranged closest to a common terminal of the transmitting filter and the transmitting filter includes a surface acoustic wave resonator, and at least one resonator excluding the resonator that is arranged closest to the common terminal includes a film bulk acoustic wave resonator.

With this arrangement, the resonator of the serial resonators and the parallel resonators in the transmitting filter that is arranged closest to the common terminal of the transmitting filter and the transmitting filter is an acoustic wave resonator (such as a surface acoustic wave resonator or a boundary acoustic wave resonator) that has superior secondary non-linear characteristics to a film bulk acoustic wave resonator. The generation of the IMD is more effectively controlled than in the case in which all of the resonators in the transmitting filter are film bulk acoustic wave resonators. At least one of the other resonators in the transmitting filter is a film bulk acoustic wave resonator. With this arrangement, the duplexer has a low insertion loss between an antenna and a transmitter and excellent power durability similar to a duplexer in which all of the resonators in the transmitting filter are film bulk acoustic wave resonators.

Preferably, the resonator of the serial resonators and the parallel resonators in the transmitting filter that is arranged closest to the common terminal is a parallel resonator, and each of the parallel resonator and a serial resonator of the serial resonators in the transmitting filter that is arranged closest to the common terminal is a surface acoustic wave resonator.

The parallel resonator that is arranged closest to the common terminal and the serial resonator that is arranged second closest to the common terminal are preferably surface acoustic resonators. This arrangement reliably controls the generation of IMD.

Preferably, the film bulk acoustic wave resonator defining at least one of the serial resonators and the parallel resonators in the transmitting filter includes a substrate, and a vibrator having a piezoelectric thin film arranged between a pair of electrodes on one of the main surfaces of the substrate, and being acoustically isolated from the substrate. The pair of electrodes preferably have approximately the same thickness.

Since the vibrator includes electrodes on both sides of the piezoelectric thin-film that are symmetrically arranged with respect to the piezoelectric thin film, vibration propagates symmetrically in the direction of thickness. The secondary non-linear phenomenon is controlled accordingly, and the generation of IMD is reduced to a greater extent.

Preferably, the vibrator of the film bulk acoustic wave resonator defining at least one of the serial resonators and the parallel resonators in the transmitting filter further includes a pair of insulating layers arranged respectively on another side with the piezoelectric thin film of the pair electrode. The pair of insulating layers preferably have approximately the same thickness.

With this arrangement, the generation of IMD is controlled while electrode durability is improved.

Preferably, the film bulk acoustic wave resonator defining at least one of the serial resonators and the parallel resonators in the transmitting filter includes a substrate, and a vibrator including a piezoelectric thin film arranged between a pair of electrodes on one of the main surfaces of the substrate, and being acoustically isolated from the substrate. Any two adjacent sides of the outline of the vibrator including the pair of electrodes with the piezoelectric thin film sandwiched therebetween are connected to one another in a smoothly curved corner when viewed in the direction of thickness of the vibrator.

Since the corner of the vibrator in the film bulk acoustic wave resonator is curved, a vibration reflection state within the vibration is prevented from being discontinuous at the corner. The generation of IMD is further reduced.

Preferably, the film bulk acoustic wave resonator defining at least one of the serial resonators and the parallel resonators in the transmitting filter includes a substrate, a vibrator including a piezoelectric thin film arranged between a pair of electrodes on one of the main surfaces of the substrate, and being acoustically isolated from the substrate, and routing wiring routed to the electrodes. The routing wiring preferably includes a curved portion extending along the outline of the vibrator when viewed in the direction of thickness of the vibrator and connected to the pair of electrodes with the piezoelectric thin film sandwiched therebetween.

In the film bulk acoustic wave resonator, the portion of the routing wiring connected to the vibrator is preferably curved, for example. The vibration reflection state of the vibrator is not discontinued at the connection portion of the routing wiring. The generation of IMD is further controlled.

In accordance with various preferred embodiments of the present invention, the surface acoustic wave resonator and the film bulk acoustic wave resonator are preferably used as the resonators of the transmitting filter of the duplexer, and the surface acoustic wave resonator is preferably used as the resonator that is arranged closest to the common terminal, and the generation of IMD is controlled accordingly.

Other features, elements, characteristics and advantages of the present invention will become more apparent from the following detailed description of preferred embodiments of the present invention with reference to the attached drawings.

BRIEF DESCRIPTION OF THE DRAWINGS

FIGS. 5A to 5F are sectional views of a film bulk acoustic wave resonator in accordance with the first preferred embodiment of the present invention;

DETAILED DESCRIPTION OF PREFERRED EMBODIMENTS

Preferred embodiments of the present invention are described below with reference to FIGS. 1-6.
First Preferred Embodiment A duplexer 100 according to a first preferred embodiment of the present invention is described below with reference to FIGS. 1 to 5F.

Figure 1:
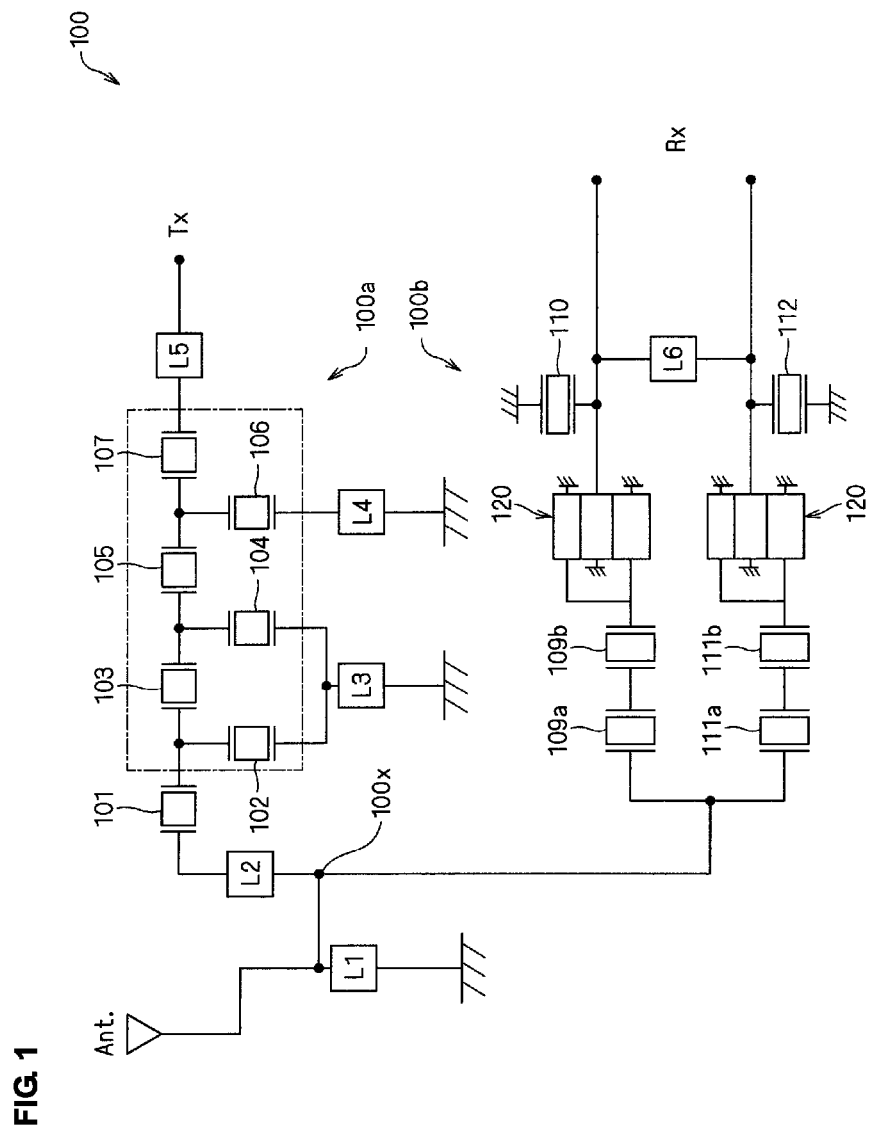
FIG. 1 is an electrical circuit diagram of a duplexer in accordance with a first preferred embodiment of the present invention.

Referring to FIG. 1, the duplexer 100 preferably includes a transmitting filter 100a arranged between an antenna terminal and a Tx terminal and a receiving filter 100b arranged between the antenna terminal and an Rx terminal. The duplexer 100 includes resonators 101-112 and longitudinally coupled filters 120. Preferably, inductors L1-L7 may be included in the duplexer 100 or may be external to the duplexer 100, for example.

Preferably, the transmitting filter 100a arranged between the antenna terminal and the Tx terminal includes four serial resonators 101, 103, 105, and 107 and three parallel resonators 102, 104, and 106 that are connected in a ladder configuration. The receiving filter 100b arranged between the antenna terminal and the Rx terminal includes resonators 109a, 109b, 110, 111a, 111b, and 112 and the longitudinally coupled filters 120. The resonators 109a and 109b in the receiving filter 100b may preferably be replaced with a single resonator. The resonators 111a and 111b in the receiving filter 100b may preferably be replaced with a single resonator.

An unbalanced signal can be input to or output from the Tx terminal. The receiving filter 100b has a function of transforming an unbalanced signal into a balanced signal, and outputs a balanced signal to the Rx terminal.

The resonator 101 of the resonators 101-107 in the transmitting filter 100a that is arranged closest to the antenna terminal, i.e., that is arranged closest to a common terminal 100x of the transmitting filter 100a and the receiving filter 100b, is defined by one of a surface acoustic wave (SAW) resonator and a boundary acoustic wave resonator. The other resonators 102-107 are defined by film bulk acoustic wave (BAW) resonators.

The resonators 109a, 109b, 110, 111a, 111b, and 112 and the longitudinally coupled filters 120 in the receiving filter 100b may preferably be provided in the same chip as that of the serial resonator 101 as one of the SAW resonator and the surface boundary wave resonator in the transmitting filter 100a. For example, the serial resonator 101 in the transmitting filter 100a and the resonators 109a, 109b, 110, 111a, 111b, and 112 and the longitudinally coupled filters 120 in the receiving filter 100b are preferably all provided and wired in the same chip on a lithium tantalate substrate as illustrated in FIG. 1.

The resonators 110 and 112 in the receiving filter 100b may be BAW resonators. The resonators 110 and 112 may be thus formed on the same chip as that of the resonators 102-107 formed of the BAW resonators in the transmitting filter 100a.

If the transmitting filter 100a and the receiving filter 100b in the duplexer include the film bulk acoustic wave resonator and one of the surface acoustic wave resonator and the boundary acoustic wave resonator, the following advantages are provided.

The generation of IMD is effectively controlled and noise mixing into a reception signal is eliminated. If the duplexer 100 is included in a mobile telephone system, the quality and performance of the mobile telephone system is improved.

Figure 2:
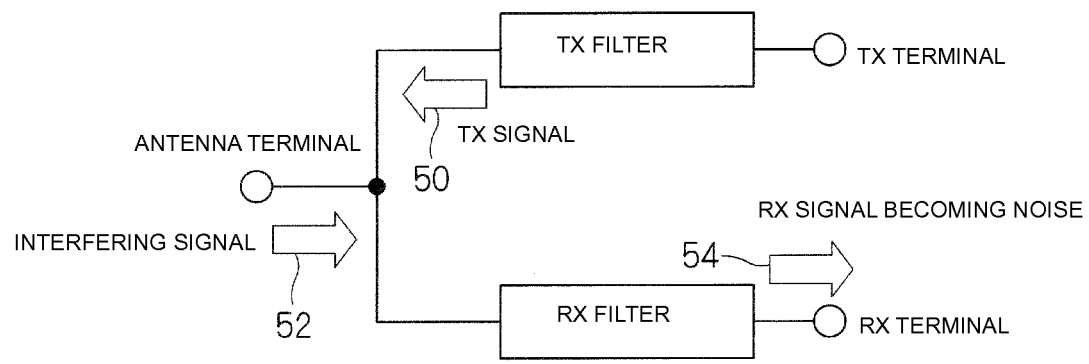
FIG. 2 is a block diagram of the duplexer in accordance with the first preferred embodiment of the present invention.

IMD of the duplexer is illustrated in FIG. 2. The duplexer, which as has non-linear characteristics, may combine a transmission signal (Tx signal) 50 input via the Tx terminal and interfering signal 52 input via the antenna terminal, thereby generating a reception signal 54 at the Rx terminal as a noise.

Generally, IMD is a phenomenon that is positively used in a mixer circuit provided in a semiconductor device having non-linearity. However, since IMD degrades the quality of the reception signal in the duplexer, it is necessary to control the generation of IMD.

One element in the duplexer that causes IMD due to the combination of the Tx signal and the interfering signal is the resonator 101 that is arranged close to the antenna terminal in the transmitting filter 100a in FIG. 1.

The use of one of the SAW resonator and the boundary acoustic wave resonator, each of which has less non-linear distortion than the BAW resonator, as the resonator 101 in the transmitting filter 100a effectively controls the generation IMD in the duplexer 100.

The use of the BAW resonator has a Q value that is greater than that of each of the SAW resonator and the boundary acoustic wave resonator for the majority of the elements in the transmitting filter 100a results in the duplexer 100 including the transmitting filter 100a having a low insertion loss.

With this arrangement, a low power consumption design is provided in the mobile telephone system. In addition, the duplexer having a filter having outstanding sharpness is produced. Such a duplexer is suitable for use in applications in a mobile telephone system in which the spacing between a transmission band and a reception band is relatively narrow. Such mobile telephone systems include code division multiple access (CDMA), personal communication service (PCS), and universal mobile telecommunications system (UMTS) Band 2, 3, 8 system, for example.

A high-power signal amplified by a power amplifier is input to the Tx terminal of the transmitting filter 100a, and a large amount of heat is typically generated. The BAW resonator which has superior power durability to the SAW resonator is used for the majority of the resonators of the transmitting filter 100a, for example, for the resonators 102-107. Therefore, the duplexer 100 including the transmitting filter 100a has high power durability.

The number of chips mounted on the duplexer is preferably two, for example, if the SAW resonator of the receiving filter 100b and the SAW resonator 101 of the transmitting filter 100a are integrated into a single chip. Accordingly, the duplexer can be miniaturized at low cost.

The resonators 110 and 112 in the receiving filter 100b are preferably BAW resonators and the BAW resonators 102-107 in the transmitting filter 100a and the resonators 110 and 112 in the receiving filter 100b are integrated in a single chip. Since the BAW resonator has a higher surge voltage than the SAW resonator and is connected to the Rx terminal, surge withstand voltage of the Rx terminal is increased.

Figure 3:
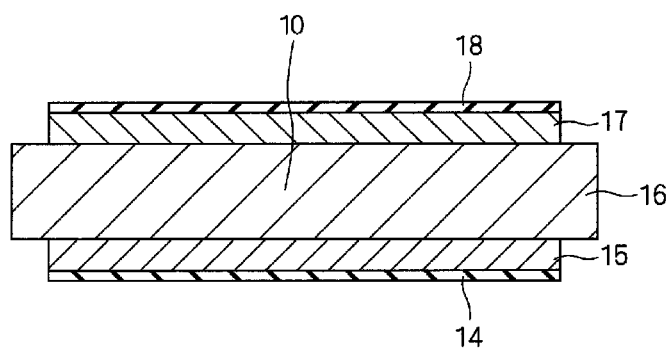
FIG. 3 is a sectional view of the major portion of the duplexer in accordance with the first preferred embodiment of the present invention.

FIG. 3 is a sectional view of the major portion of the BAW resonator used in the transmitting filter 100a and the receiving filter 100b. The BAW resonator defining the transmitting filter 100a and the receiving filter 100b includes insulating layers 14 and 18 arranged on the outer sides of a pair of electrodes 15 and 17 that sandwich a piezoelectric thin film 16. The BAW resonator has a substantially symmetrical structure with respect to the piezoelectric thin film 16 when viewed in a direction perpendicular or substantially perpendicular to a direction of thickness of the BAW resonator (e.g., the vertical direction in the plane of FIG. 3).

The upper electrode 17 and the lower electrode 15 are preferably made of the same or substantially the same material and have the same or substantially the same thickness. The upper insulating layer 18 to be deposited on the upper electrode 17 and the lower insulating layer 14 to be deposited on the lower electrode 15 are made of the same or substantially the same material and have the same or substantially the same thickness.

If the structure in the direction of thickness is symmetrical or substantially symmetrical with respect to the piezoelectric thin film 16, vibrations propagate in the direction of thickness of the piezoelectric thin film 16 in a symmetrical configuration, and the secondary non-linear phenomenon is effectively controlled. More specifically, the generation of IMD is effectively controlled in the duplexer including the BAW resonator.

The secondary non-linear phenomenon is effectively controlled if the vibration propagation is symmetrical. Preferably, the total thickness of the upper electrode 17 and the upper insulating layer 18 is approximately equal to the total thickness of the lower electrode 15 and the lower insulating layer 14. Even if the upper electrode 17 has a slightly different thickness than the lower electrode 15, or even if the upper insulating layer 18 has a slightly different thickness than the lower insulating layer 14, the generation of IMD is still effectively controlled.

More specifically, the pair of electrodes 15 and 17 respectively arranged on the two sides of the piezoelectric thin film 16 are preferably approximately equal to each other in thickness. Furthermore, the insulating layers 14 and 18, respectively arranged on the electrodes 15 and 17 on the piezoelectric thin film 16, are preferably approximately equal to each other in thickness.

Figure 4A:
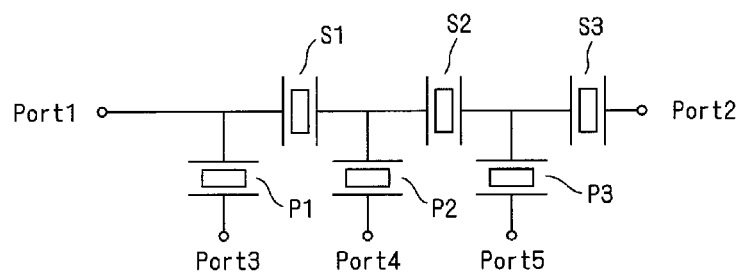
FIGS. 4A to 4C illustrate a layout of the duplexer in accordance with the first preferred embodiment of the present invention.

FIG. 4A is an electrical circuit diagram of the resonators 102-107 of the transmitting filter 100a that are enclosed in a broken-lined box in FIG. 1. Port 1 in FIG. 4A is connected to the serial resonator 101 shown in FIG. 1. Port 3 and Port 4 in FIG. 4A are connected to the inductor L3 shown in FIG. 1. Port 5 in FIG. 4A is connected to the inductor L4 shown in FIG. 1. Port 2 in FIG. 4A is connected to the inductor L5 shown in FIG. 1.

Figure 4B:
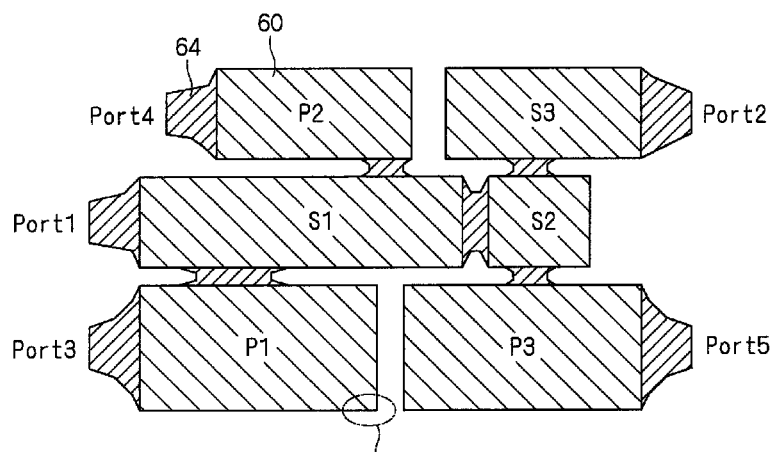

FIG. 4B is a see-through view of a layout of serial resonators S1-S3 and parallel resonators P1-P3 shown in FIG. 4A, when in the direction of thickness. Vibrators 6 of the resonators S1-S3 and P1-P3 are connected via routing wirings 64. Each vibrator 60 is preferably defined by an area of a pair of electrodes that overlap each other with a piezoelectric thin film interposed therebetween.

As shown in FIG. 4B, the routing wiring 64 does not have a constant width, but rather has a reverse taper shape extending toward the vibrator 60. A portion of the routing wiring 64 that is arranged close to the vibrator 60 preferably has a smooth curve and is connected to the outline of the vibrator 60. The curved portion of the routing wiring 64 connected to the vibrator 60 prevents the vibration reflection of the vibrator 60 from being discontinuous at a connection portion of the vibrator 60 with the routing wiring 64. The generation of IMD is thus effectively controlled.

Figure 4C:
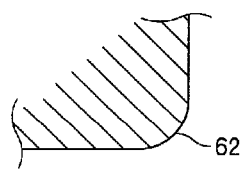

As shown in a see-through view of FIG. 4C, the outline of a corner at which where the adjacent sides of the vibrator 60 join each other is preferably rounded. The vibrator 60 has an outline in which two adjacent sides continue with each other in a smooth curve.

Since the vibrator 60 has an outline including rounded corners, the vibration reflection within the vibrator 60 is not discontinuous at the corner. The generation of IMD is thus controlled.

The BAW resonators defining the transmitting filter 100a and the receiving filter 100b preferably have a variety of configurations as shown in sectional views of FIGS. 5A to 5F.

FIG. 5A illustrates a vibrator 10 that includes the piezoelectric thin film 16 sandwiched between the pair of electrodes 15 and 17, which are in turn sandwiched between the insulating layers 14 and 18. The vibrator 10 is floating from a substrate 12 with a gap interposed therebetween. The gap 13 is formed by depositing a sacrificial layer on the substrate 12, forming the layers 14-18, and removing the sacrificial layer. Optionally, the lower insulating layer 14 may preferably be manufactured of a material that is different from the material of the upper insulating layer 18.

FIG. 5B shows a vibrator 10 that includes the piezoelectric thin film 16 sandwiched between the pair of electrodes 15 and 17, which are in turn sandwiched between the insulating layers 14 and 18. The vibrator 10 is arranged on a cavity 12s that extends entirely through the substrate 12. The cavity 12s can preferably be formed by etching the substrate 12 from the underside thereof. In this case, the lower insulating layer 14 is made of an etch-free material.

FIG. 5C shows a vibrator 10 that includes the piezoelectric thin film 16 sandwiched between the pair of electrodes 15 and 17, which are in turn sandwiched between the insulating layers 14 and 18. The vibrator 10 is arranged on a cavity 12t that extends partially but not entirely through the substrate 12. The cavity 12t is preferably formed beforehand in the substrate 12 and is then filled with a sacrifice layer. After the vibrator 10 is produced with the cavity 12t filled with the sacrifice layer, the sacrifice layer is removed.

FIGS. 5D-5F show examples in which an acoustic reflective layer is sandwiched between a vibrator 10a and the substrate 12. The acoustic reflective layer is preferably produced by alternately laminating a low acoustic impedance layer 30 having a relatively low acoustic impedance, and a high acoustic impedance layer 32 having a relatively high acoustic impedance. More specifically, the acoustic reflective layer is produced by alternately laminating materials having different acoustic impedances.

FIG. 5D shows an example in which the vibrator 10a is provided on an acoustic reflective layer that entirely or substantially entirely covers the top of the substrate 12.

FIG. 5E shows an example in which the vibrator 10a is provided on acoustic reflective layers 30 and 32 that are disposed in a recess 12k of the substrate 12.

FIG. 5F shows an example in which the vibrator 10a is provided on a portion of the substrate 12.

Optionally, the acoustic reflective layer 30 in contact with the lower electrode 15 may preferably be designed to function as a lower insulating layer.

Second Preferred Embodiment

A duplexer 200 according to a second preferred embodiment of the present invention is described below with reference to FIG. 6.

The duplexer 200 of the second preferred embodiment of the present invention is generally identical in structure to the duplexer of the first preferred embodiment. The difference between the two duplexers is described below.

Figure 6:
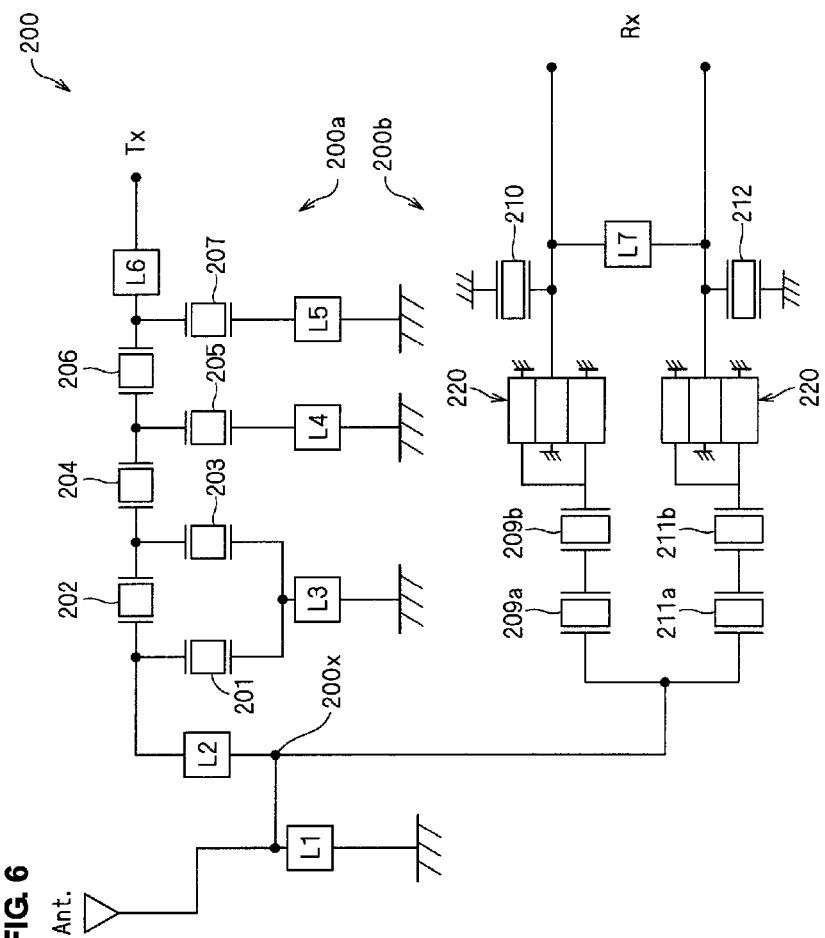
FIG. 6 is an electrical circuit diagram of a duplexer in accordance with a second preferred embodiment of the present invention.
Figure 7:
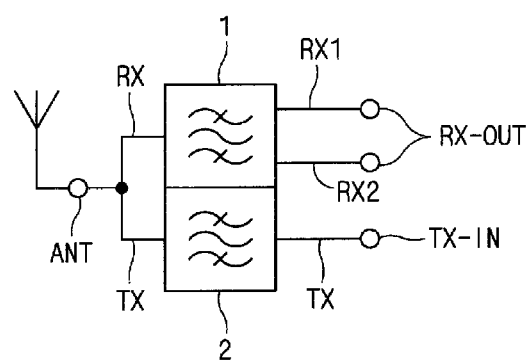
FIG. 7 is an electrical circuit diagram of a known duplexer.

As shown in the circuit diagram of FIG. 6, the duplexer 200 includes a transmitting filter 200a arranged between an antenna terminal and a Tx terminal and a receiving filter 200b arranged between the antenna terminal and an Rx terminal. More specifically, the duplexer 200 includes resonators 201-212 and longitudinally coupled filters 220. Preferably, inductors L1-L7 may be included in the duplexer 200 or may be external to the duplexer 200.

The transmitting filter 200a in the duplexer 200 according to the second preferred embodiment is different from the transmitting filter 100a in the first preferred embodiment. More specifically, the transmitting filter 200a arranged between the antenna terminal and the Tx terminal includes three serial resonators 202, 204, and 206 and four parallel resonators 201, 203, 205, and 207 arranged in a ladder configuration.

The resonator 201 of the resonators 201-207 in the transmitting filter 200a that is arranged closest to the antenna terminal, i.e., closest to a common terminal 200x of the transmitting filter 200a and the receiving filter 200b, is one of a surface acoustic wave (SAW) resonator and a boundary acoustic wave resonator. The resonator 202 that is second closest to the common terminal 200x is also preferably defined by one of a surface acoustic wave (SAW) resonator and a boundary acoustic wave resonator. The other resonators 203-207 are defined by film bulk acoustic wave (BAW) resonators.

The receiving filter 200b arranged between the antenna terminal and the Rx terminal has the same or substantially the same structure as the receiving filter 100b of the duplexer of the first preferred embodiment. The receiving filter 200b includes resonators 209a, 209b, 210, 211a, 211b, and 212 and a longitudinally coupled filter 220. The resonators 209a and 209b in the receiving filter 200b may preferably be replaced with a single resonator. The resonators 211a and 211b in the receiving filter 200b may preferably be replaced with a single resonator.

If each of the two resonators 201 and 202 is defined by one of a surface acoustic wave resonator and a boundary acoustic wave resonator, the same or substantially the same advantages as those of the first preferred embodiment are provided.

As described above, at least the resonator that is arranged closest to the antenna terminal is a surface acoustic wave resonator, and the other resonators in the transmitting filter are film bulk acoustic wave resonators. The generation of IMD is more effectively controlled than when all of the resonators in the transmitting filter are film bulk acoustic wave resonators. The insertion loss between the antenna and the transmitter is reduced to approximately the same level as the level applied when all of the resonators in the transmitting filter are defined by film bulk acoustic wave resonators. The duplexer also provides high power durability.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A duplexer comprising:
    a transmitting filter including serial resonators and parallel resonators connected in a ladder configuration; and
    a receiving filter; wherein
    a resonator of the serial resonators and the parallel resonators in the transmitting filter that is arranged closest to a common terminal of the transmitting filter and the receiving filter includes a surface acoustic wave resonator;
    at least one resonator excluding the resonator that is arranged closest to the common terminal is defined by a film bulk acoustic wave resonator;
    the film bulk acoustic wave resonator defining at least one of the serial resonators and the parallel resonators in the transmitting filter comprises:
        a substrate; and
        a vibrator having a piezoelectric thin film arranged between a pair of electrodes on one of the main surfaces of the substrate, and being acoustically isolated from the substrate; and
        any two adjacent sides of the vibrator including the pair of electrodes with the piezoelectric thin film sandwiched therebetween are connected to each other in a smoothly curved corner when viewed in the direction of thickness of the vibrator.

2. The duplexer according to claim 1, wherein
    the resonator that is arranged closest to the common terminal includes a parallel resonator; and
    each of the parallel resonator and a serial resonator of the serial resonators in the transmitting filter that is arranged closest to the common terminal includes a surface acoustic wave resonator.

3. The duplexer according to claim 1, wherein
    the pair of electrodes have approximately the same thickness.

4. The duplexer according to claim 3, wherein
    the vibrator of the film bulk acoustic wave resonator defining at least one of the serial resonators and the parallel resonators in the transmitting filter further comprises a pair of insulating layers arranged respectively on the pair of electrodes; and
    each of the pair of insulating layers has approximately the same thickness.

5. The duplexer according to claim 1, wherein the film bulk acoustic wave resonator defining at least one of the serial resonators and the parallel resonators in the transmitting filter, further comprises:
    routing wiring routed to the pair of electrodes; and
    the routing wiring includes a curved portion extending smoothly along an outline of the vibrator when viewed in a direction of thickness of the vibrator and connected to the pair of electrodes with the piezoelectric thin film sandwiched therebetween.

* * * * *